US010297316B2

(12) United States Patent
Lin et al.

(10) Patent No.: US 10,297,316 B2
(45) Date of Patent: May 21, 2019

(54) PHASE CHANGE MEMORY APPARATUS AND READ CONTROL METHOD TO REDUCE READ DISTURB AND SNEAK CURRENT PHENOMENA

(71) Applicant: MACRONIX INTERNATIONAL CO., LTD., Hsinchu (TW)

(72) Inventors: Yung-Feng Lin, Taoyuan (TW); Yun-Chen Chou, Hsinchu (TW); Hsin-Yi Ho, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/687,687

(22) Filed: Aug. 28, 2017

(65) Prior Publication Data
US 2019/0066778 A1 Feb. 28, 2019

(51) Int. Cl.
*G11C 13/00* (2006.01)

(52) U.S. Cl.
CPC ........ *G11C 13/004* (2013.01); *G11C 13/0004* (2013.01); *G11C 13/0026* (2013.01); *G11C 13/0028* (2013.01); *G11C 2013/0045* (2013.01)

(58) Field of Classification Search
CPC ............ G11C 13/0026; G11C 11/5678; G11C 13/0004; G11C 2013/0045
See application file for complete search history.

(56) References Cited

U.S. PATENT DOCUMENTS

| 7,154,774 | B2 * | 12/2006 | Bedeschi | ............... G11C 7/062 365/163 |
| 7,751,226 | B2 | 7/2010 | Kau | |
| 9,418,738 | B2 | 8/2016 | Castro | |
| 2006/0227590 | A1 * | 10/2006 | Parkinson | ............... G11C 7/062 365/148 |
| 2006/0227591 | A1 * | 10/2006 | Lowrey | ............. G11C 13/0004 365/148 |
| 2006/0233019 | A1 * | 10/2006 | Kostylev | ............. G11C 11/5678 365/163 |

(Continued)

OTHER PUBLICATIONS

Chen, et el.: "An Access-Transistor-Free (OT/IR) Non-Volatile Resistance Random Access Memory (RRAM) Using a Novel Threshold Switching, Self-Rectifying Chalcogenide Device"; 0/7803-7872-5103/$17.00 copyright 003 IEEE; pp. 34.4.1-37.4.4.

(Continued)

*Primary Examiner* — Mushfique Siddique
(74) *Attorney, Agent, or Firm* — McClure, Qualey & Rodack, LLP

(57) ABSTRACT

A memory device and associated control methods are provided. The memory device is electrically connected to M bit lines and N word lines. The memory device includes a memory array having memory cells and a controller. The memory cells are located at intersections of the M bit lines and the N word lines. A selected memory cell including a storage element and a selector switch is electrically connected to an m-th bit line and an n-th word line. The controller changes a cell cross voltage of the selected memory cell in the first duration, the second duration, and the post duration, respectively. The cell cross voltage in the first duration is greater than the cell cross voltage in the post duration, and the cell cross voltage in the post duration is greater than the cell cross voltage in the second duration.

14 Claims, 13 Drawing Sheets

(56) References Cited

U.S. PATENT DOCUMENTS

| | | | |
|---|---|---|---|
| 2009/0027951 A1* | 1/2009 | Kau | G11C 13/0004 |
| | | | 365/163 |
| 2010/0232205 A1* | 9/2010 | Parkinson | G11C 11/56 |
| | | | 365/148 |
| 2011/0286260 A1* | 11/2011 | Tsukamoto | G11O 5/147 |
| | | | 365/148 |
| 2015/0206581 A1 | 7/2015 | Gordon et al. | |
| 2015/0325289 A1* | 11/2015 | Castro | G11C 13/0004 |
| | | | 365/148 |
| 2016/0012886 A1 | 1/2016 | Nazarian et al. | |
| 2016/0133319 A1* | 5/2016 | Fantini | G11C 13/003 |
| | | | 365/163 |
| 2016/0267970 A1* | 9/2016 | Perner | G11C 13/003 |
| 2016/0284399 A1 | 9/2016 | Mantegazza et al. | |
| 2017/0243641 A1* | 8/2017 | Kim | G11C 13/004 |
| 2017/0352410 A1* | 12/2017 | Castro | G11C 13/0004 |

OTHER PUBLICATIONS

Aluguri, et al.: "Overview of Selector Devices for 3-D Stackable Cross Point RRAM Arrays"; Journal of the Electron Devices Society; vol. 4, No. 5, Sep. 2016; pp. 294-306.

Czubatyj, et al.: "Invited Paper: Thin-Film Ovonic Threshold Switch: Its Operation and Application in Modern Integrated Circuits"; Electronic Materials Letters, vol. 8, No. 2 (2012), pp. 157-167.

Karpov, et al.: "Phase Change Memory with Chalcogenide Selector (PCMS): Characteristic Behaviors, Physical Models and Key Material Properties"; Mater. Res. Soc. Symp. Proc. vol. 1250 © 2010 Materials Research Society 1250-G14-01-H07-01; pp. 1-10.

* cited by examiner

PHASE CHANGE MEMORY APPARATUS AND READ CONTROL METHOD TO REDUCE READ DISTURB AND SNEAK CURRENT PHENOMENA

BACKGROUND OF THE INVENTION

Field of the Invention

The invention relates in general to a memory device and associated control method, and more particularly to a memory device and associated control method for performing a read operation.

Description of the Related Art

As is well known, consumer electronics has exponentially increased the need for memory size. Therefore, usage demands of nonvolatile memories (hereinafter, NVM) are continuously growing, and new class of memory technologies has rapidly developed.

Among various NVM technologies, phase change materials (hereinafter, PCM) technology has made rapid progress in a short time. Conventionally, the minimum lithographic resolution is commonly referred to as "F" and an area equal to "$4F^2$" is often considered a desired design goal for a memory cell to achieve maximum density.

FIG. 1 is a schematic diagram of a PCM memory array based on a crossbar scheme. As shown in FIG. 1, a PCM memory cell is corresponding to an area equal to "$4F^2$". That is, the PCM memory cell size is marching towards minimum achievable feature size. The cost of manufacturing memory is inversely related to bit density. Therefore, the PCM technology becomes attractive because the PCM memory can be manufactured at very high density.

The memory array in FIG. 1 is electrically connected to 4 bit lines (BL1~BL4) and 4 word lines (WL1~WL4). The memory array includes 16 PCM memory cells (M11~M44) which are arranged at intersections of the bit lines BL1~BL4 and the word lines WL1~WL4. The PCM memory cells operate in two phases, a highly conductive state (that is, poly-crystalline state) and a highly resistive state (that is, amorphous state). Transition between the two phases is achieved by changing voltage difference between two terminals of the PCM memory cell.

In a case that a read operation is performed to the memory cell M32, a read current originating from the bit line BL3 flows through the memory cell M32 and flows to the word line WL2. Then, the read current flowing through the memory cell CM32 is utilized to determine a storage state of the memory cell M32. The storage state of the memory cell M32 is corresponding to data content to be stored at the memory cell M32. However, the storage state of the PCM memory cell can be disturbed by inadvertently larger voltage difference between the bit lines and the word lines dropped on PCM device after a selector switch was turned on, and the cell was scathed a little and finally the data content may be incorrectly fetched. Therefore, performing a reliable read operation to the PCM memory is an important issue.

SUMMARY OF THE INVENTION

The invention is directed to a memory device and associate control method. A control method is applied to a read operation of the memory device. According to the control method, voltages to be applied to the bit line and the word line which are connected to a selected memory cell are changed in different stages of the read operation in order to prevent from causing read disturb phenomenon.

According to a first aspect of the present disclosure, a memory device is provided. The memory device is electrically connected to M bit lines and N word lines. The memory device includes a memory array and a controller. The memory array includes MxN memory cells being located at intersections of the M bit lines and the N word lines. A memory cell being electrically connected to an m-th bit line among the M bit lines and an n-th word line among the N word lines is defined as a selected memory cell. The selected memory cell includes a storage element and a selector switch. The storage element is electrically connected to one of the m-th bit line and the n-th word line. The storage element receives a predefined constant voltage during a read duration including a first duration, a second duration, and a post duration. The selector switch is electrically connected to the other one of the m-th bit line and the n-th word line. The controller is electrically connected to the memory array. The controller changes a cell cross voltage of the selected memory cell in the first duration, the second duration, and the post duration, respectively. The cell cross voltage in the first duration is greater than the cell cross voltage in the post duration, and the cell cross voltage in the post duration is greater than the cell cross voltage in the second duration. Then, the controller compares a sensing voltage and a reference voltage to determine a storage state of the storage element. The sensing voltage is related to voltage of the other one of the m-th bit line and the n-th word line.

According to a second aspect of the present disclosure, a control method applied to a memory cell in a memory device is provided. The memory cell includes a storage element and a selector switch. The storage element is electrically connected to an m-th bit line and the selector switch is electrically connected to an n-th word line. The control methods includes following steps. Firstly, the m-th bit line is applied with a predefined constant voltage during a read duration including a first duration, a second duration, and a post duration. A selector cross voltage is greater than a threshold voltage of the selector switch in the first duration. Then, voltage of the n-th word line is changed during the read duration. A cell cross voltage of the memory cell in the first duration is greater than the cell cross voltage in the post duration, and the cell cross voltage in the post duration is greater than the cell cross voltage in the second duration. Later, a sensing voltage and a reference voltage are compared to determine a storage state of the storage element, wherein the sensing voltage is related to the voltage of the n-th word line.

According to a third aspect of the present disclosure, a control method applied to a memory cell in a memory device is provided. The memory cell includes a storage element and a selector switch. The storage element is electrically connected to an n-th word line and the selector switch is electrically connected to an m-th bit line. The control methods includes following steps. Firstly, the n-th word line is applied with a predefined constant voltage during a read duration comprising a first duration, a second duration, and a post duration. A selector cross voltage is greater than a threshold voltage of the selector switch in the first duration. Then, voltage of the m-th bit line is changed during the read duration. A cell cross voltage of the memory cell in the first duration is greater than the cell cross voltage in the post duration, and the cell cross voltage in the post duration is greater than the cell cross voltage in the second duration. Later, a sensing voltage and a reference voltage are compared to determine a storage state of the storage element, wherein the sensing voltage is related to the voltage of the m-th bit line.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
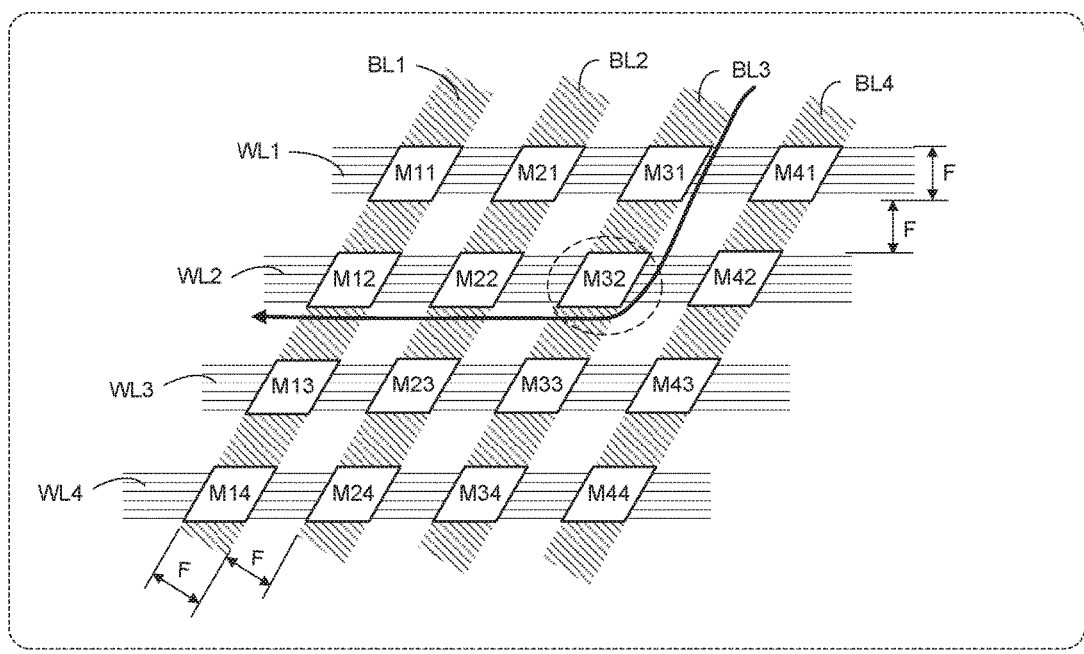
FIG. 1 (Prior Art) is a schematic diagram of a PCM memory array based on a crossbar scheme.
Figure 2:
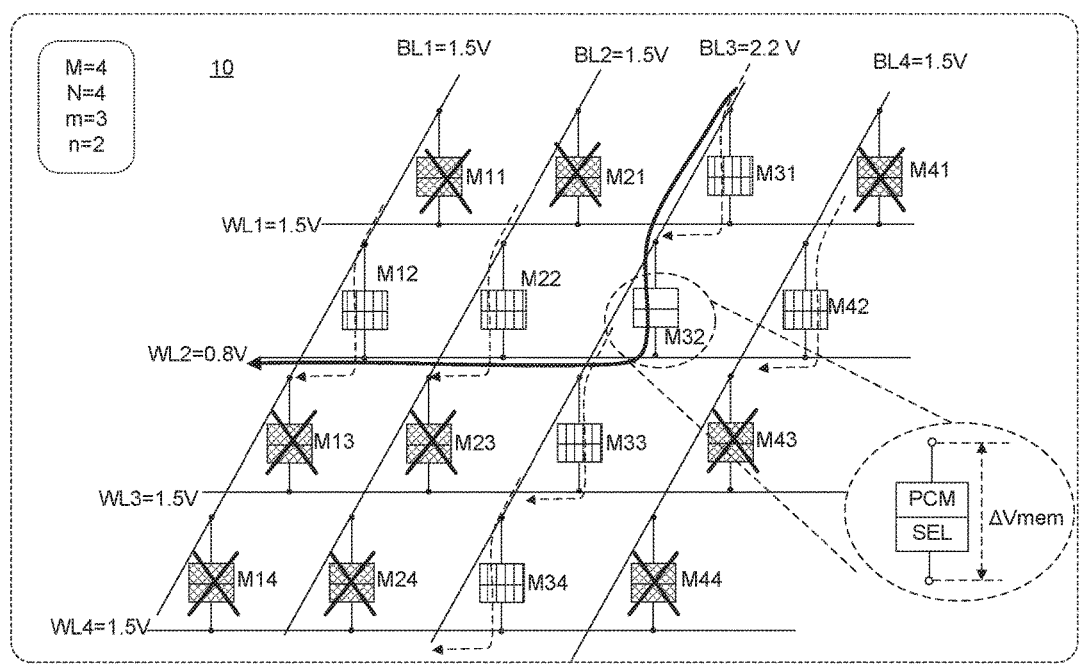
FIG. 2 is a schematic diagram illustrating voltage control of the PCM memory array.

FIG. 2 is a schematic diagram illustrating voltage control of the PCM memory array. The memory cells M31, M12, M22, M42, M33, M34 are shown in saltires to represent no current flowing though. The memory cells M11, M21, M41, M13, M23, M43, M14, M24, M44 shown in diagonal stripes to represent that they are semi-conducted. The memory cell M32 being fully conducted is shown in white rectangle. Moreover, a cross voltage of the memory cell M32 is represented as a cell cross voltage ΔVmem.

In order to detect the storage state of the memory cell M32, the bit line BL3 is applied with a read high voltage (that is, 2.2V), and the word line WL2 is applied with a read low voltage (that is, 0.8V). The rest bit lines BL1, BL2, BL4 and the rest word lines WL1, WL3, WL4 which are not selected are applied with the default voltage (that is, 1.5V). The memory cell M32 is fully conducted because the voltage difference between the bit line BL3 and the word line WL2 is 1.4V, and the read current, as shown by block arrow, flows from the bit line BL3 to the word line WL2. Meanwhile, some sneak currents (leakage currents), as shown by dotted arrows, can flow through memory cells M31, M12, M22, M42, M33, M34 which are located at the same column or same row of the memory cell M32.

In order to prevent sneak current phoneme of the storage element (for example, a PCM cell), each of the storage element PCM is used together with a selector switch SEL. The selector switch SEL is laid in serial with the storage element PCM, without requiring additional area. As enlarged at the lower right corner of FIG. 2, each memory cell includes a storage element PCM and a selector switch SEL.

The resistance of the selector switch SEL before the threshold switching is highly resistive with several MΩ order and after the threshold switching drops steeply to around 20 kΩ to 30 kΩ. The resistance of the storage element PCM is around 20 kΩ when the storage element PCM is highly conductive (SET state), and the order of magnitude of resistance of the storage element PCM is MΩ when the storage PCM is highly resistive (RESET state).

Basically, operation of the selector switch SEL is known as threshold switching phenomenon. When the selector switch SEL whose corresponding storage element PCM is not selected, resistance of the selector switch SEL is relatively high so that no current is conducted. When a selector switch SEL whose corresponding storage element PCM is selected, resistance of the selector is relatively low so that a large current is conducted.

Alternatively speaking, the selector switch SEL is likely to block the sneak currents accompanied with the storage elements PCM which are not actually selected for read operation but suffered from the voltage rise of the bit line BL3 or the voltage drop of the word line WL2. That is, the selector switches SEL at memory cells M31, M12, M22, M42, M33, M34 can suppress the side effects caused by the sneak currents.

In the context, the memory array is assumed to include MxN memory cells, and a memory cell located at the intersection of the m-th bit line and the n-th word line is selected (that is, a selected memory cell MEMmn). The variables M, N, m, and n are positive integers, m is smaller or equivalent to M, and n is smaller or equivalent to N. For example, in FIG. 2, it is assumed that M=4, N=4, m=3, and n=2. According to the embodiments of the present disclosure, each of the memory cells includes a storage element PCM and a selector switch SEL. The storage element PCM and the selector switch SEL are electrically connected in serial.

Figure 3A:
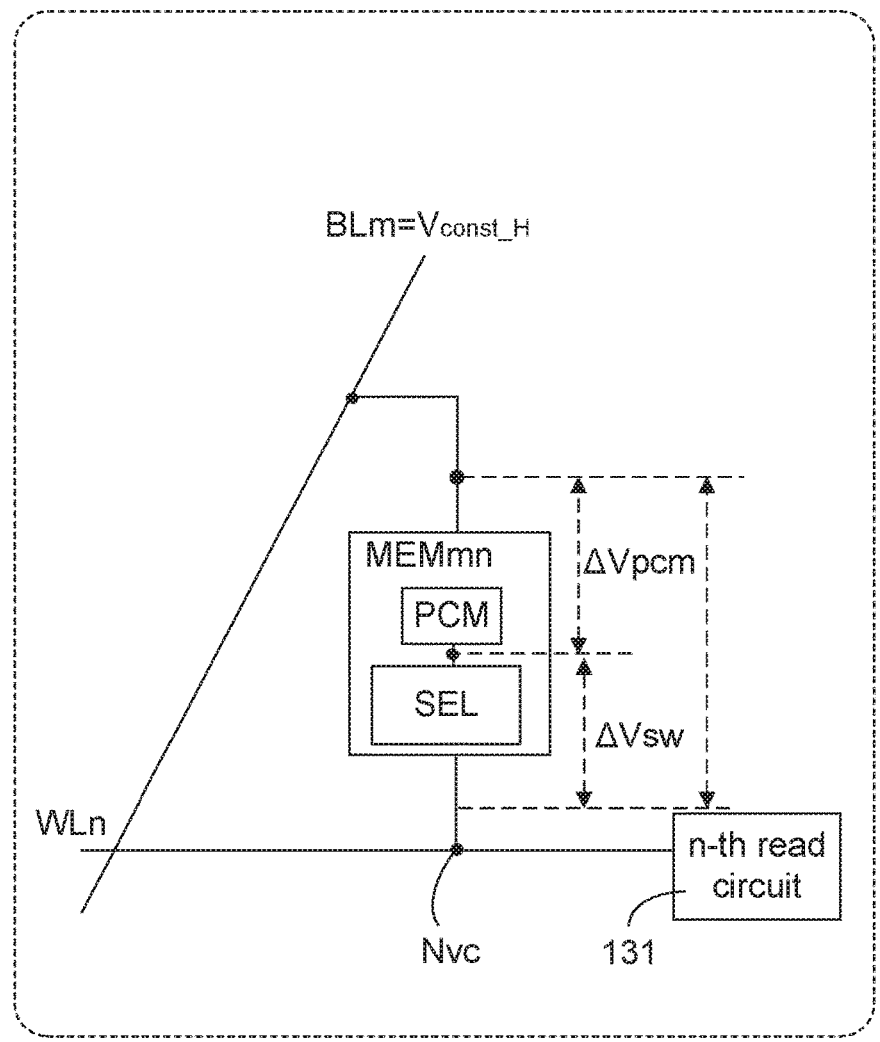
FIG. 3A is a schematic diagram illustrating a read operation performed to the selected memory cell according to an embodiment of the present disclosure.

FIG. 3A is a schematic diagram illustrating a read operation performed to the selected memory cell according to an embodiment of the present disclosure. The storage element PCM in the selected memory cell MEMmn is electrically connected to the m-th bit line BLm, and the selector switch SEL in the selected memory cell MEMmn is electrically connected to the n-th word line WLn.

In FIG. 3A, the memory device is assumed to include the memory array having MxN memory cells, a controller and N read circuits. The N read circuits are respectively corresponding to the N word lines. Among the N read circuits, an n-th read circuit 131 is electrically connected to the n-th word line WLn to acquire a sensing voltage Vsen being generated based on voltage of a dynamic control terminal Nvc. The controller sets the m-th bit line at a predefined constant voltage $V_{const\_H}$ and changes the voltage of the n-th word line WLn during a read duration Trd. Then, the sensing voltage Vsen is acquired by the n-th read circuit 131 to generate a comparison signal Scmp so that the controller can accordingly determine a storage state of the storage element PCM.

Figure 3B:
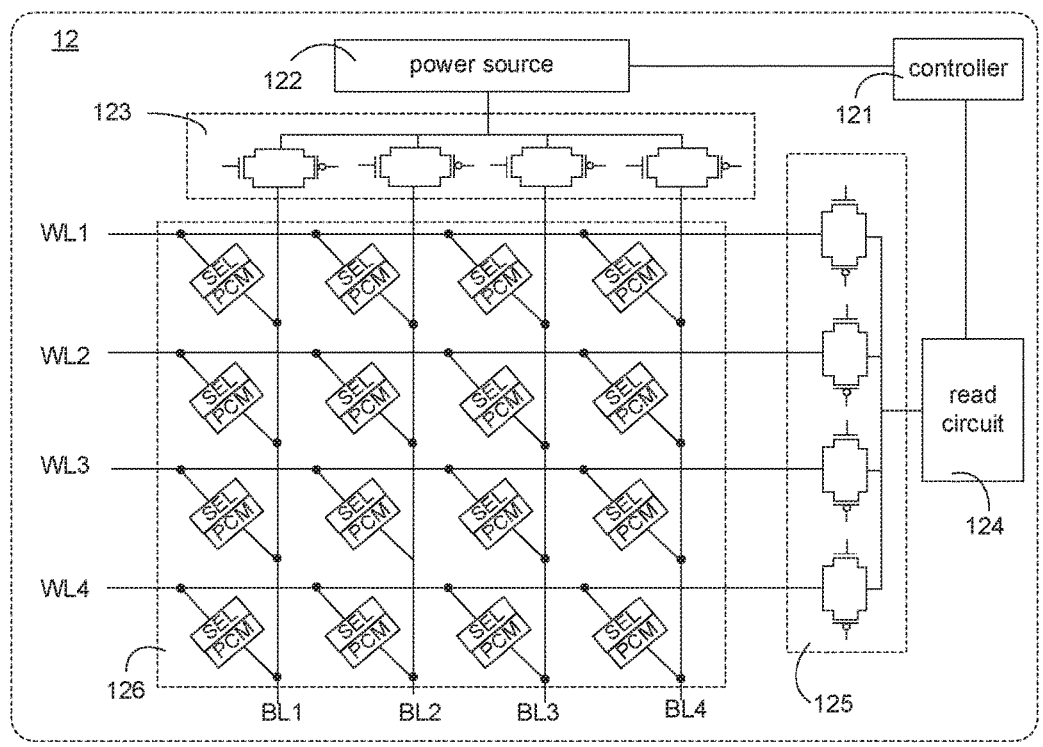
FIG. 3B is a schematic diagram illustrating a memory device having a column decoder, a row decoder and memory cells being read with the read operation shown in FIG. 3A.

In some applications, decoding circuits can be used together with the read circuits so that the number of read circuit can be less than N. FIG. 3B is a schematic diagram illustrating a memory device having a column decoder, a row decoder and memory cells being read with the read operation shown in FIG. 3A.

The memory device 12 includes a controller 121, a power source 122, a read circuit 124, a row decoder 125, a column decoder 123, and a memory array 126. In FIG. 3B, it is assumed that the memory array 126 includes 16 memory cells, and the 16 memory cells are arranged in four rows and four columns (that is, M=4 and N=4).

The storage elements PCM of the memory cells are electrically connected to the power source 122 through four bit lines BL1~BL4 and the column decoder 123. With the column decoder 123, the voltage supplied by the power source 122 can be transmitted to any of the four bit lines BL1~BL4.

The selector switches SEL of the memory cells are respectively electrically connected to the read circuit through four word lines WL1~WL4 and the row decoder 125. With the row decoder 125, the read circuit 124 can sense voltage level of any of the four word lines WL1~WL4.

Figure 3C:
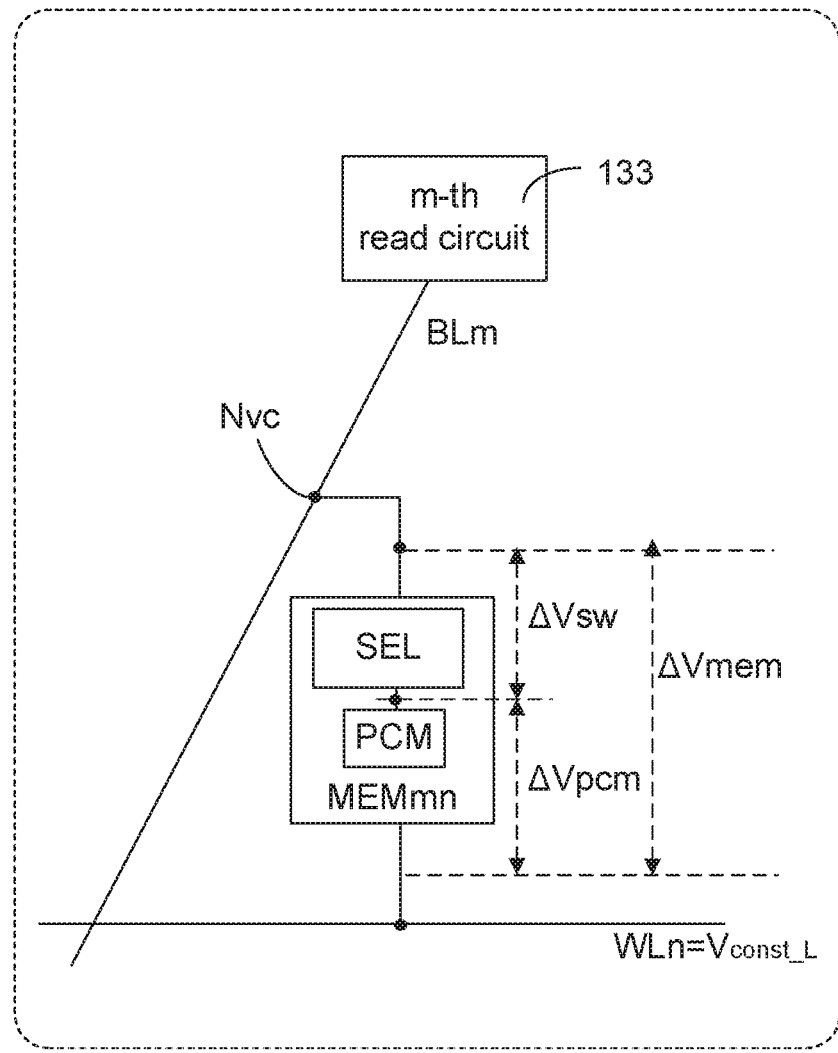
FIG. 3C is a schematic diagram illustrating a read operation performed to the selected memory cell according to another embodiment of the present disclosure.

FIG. 3C is a schematic diagram illustrating a read operation performed to the selected memory cell according to another embodiment of the present disclosure. The selector switch SEL in the selected memory cell MEMmn is electrically connected to the m-th bit line BLm, and the storage element PCM in the selected memory cell MEMmn is electrically connected to the n-th word line WLn.

In FIG. 3C, the memory device includes the memory array having MxN memory cells, a controller and M read circuits. The M read circuits are respectively corresponding to M bit lines. Among the M read circuits, an m-th read circuit 133 is electrically connected to the m-th bit line BLm to acquire a sensing voltage Vsen being generated based on voltage of a dynamic control terminal Nvc. The controller sets the n-th word line WLn at a predefined constant voltage level $V_{const\_L}$, and changes the voltage of the m-th bit line BLm during the read duration Trd. Then, the sensing voltage Vsen is acquired by the m-th read circuit 133 to generate a comparison signal Scmp so that the controller can accordingly determine the storage state of the storage element PCM.

Figure 3D:
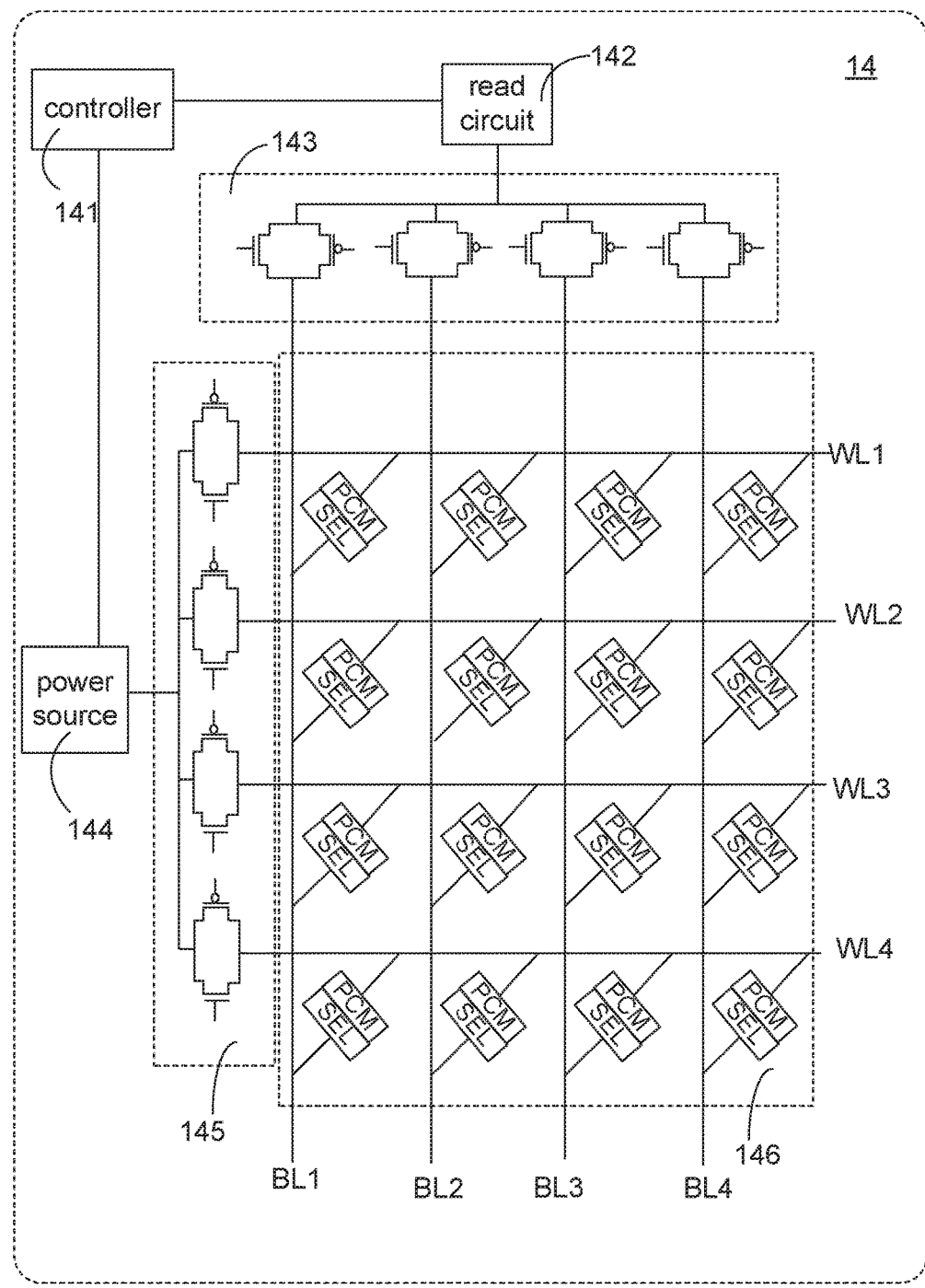
FIG. 3D is a schematic diagram illustrating a memory device having a column decoder, a row decoder and memory cells being read with the read operation shown in FIG. 3C.

In some applications, decoding circuits can be used together with the read circuits so that the number of read circuit can be less than M. FIG. 3D is a schematic diagram illustrating a memory device having a column decoder, a row decoder and memory cells being read with the read operation shown in FIG. 3C.

The memory device 14 includes a controller 141, a power source 144, a read circuit 142, a row decoder 145, a column decoder 143, and a memory array 146. In FIG. 3D, it is assumed that the memory array 146 includes 16 memory cells, and the 16 memory cells are arranged in four rows and four columns (that is, M=4 and N=4).

The storage elements PCM of the memory cells are electrically connected to the power source 144 through four word lines WL1~WL4 and the row decoder 145. With the row decoder 145, the voltage transmitted by the power source 144 can be transmitted to any of the four word lines WL1~WL4.

The selector switches SEL of the memory cells are respectively electrically connected to the read circuit 142 through four bit lines BL1~BL4 and the column decoder 143. With the column decoder 143, the read circuit 142 can sense voltage level of any of the four bit lines BL1~BL4.

As shown in FIGS. 3A and 3C, a cross voltage of the storage element PCM is defined as a storage cross voltage ΔVpcm, and a cross voltage of the selector switch SEL is defined as a selector cross voltage ΔVsw. The summation of the storage cross voltage ΔVpcm and the selector cross voltage ΔVsw is equivalent to the cell cross voltage ΔVmem.

The resistance of the selector switch SEL is varied with the state of the selector switch SEL. In a case that the selector switch SET is at the "OFF" state, the resistance of the selector switch SEL is much greater than the resistance of the storage element PCM. On the other hand, in a case that the selector switch SET is at the "ON" state, the resistance of the selector switch SEL is much less than the resistance of the storage element PCM.

Because the selector switch SEL and the storage element PCM are serially connected that the same current flows though both of which, relationship between the resistances of the selector switch SET and the storage element PCM is positively related to the relationship between the selector cross voltage ΔVsw and the storage cross voltage ΔVpcm.

As illustrated above, the resistance of the selector switch SEL is much greater than the resistance of the storage element PCM when the selector switch SET is at the "OFF" state. Accordingly, the storage cross voltage ΔVpcm is much lower than the selector cross voltage ΔVsw of the selector switch SET if the selector switch SEL is at the OFF state.

On the other hand, the resistance of the selector switch SEL is much less than the resistance of the storage element PCM when the selector switch SET is at the "ON" state. Meanwhile, the selector cross voltage ΔVsw is equivalent to the hold voltage Vhld, and the storage cross voltage ΔVpcm is much greater than the selector cross voltage ΔVsw of the selector switch SET because the resistance of the storage element PCM is greater than the resistance of the selector switch SEL at the ON state.

Figure 4A:
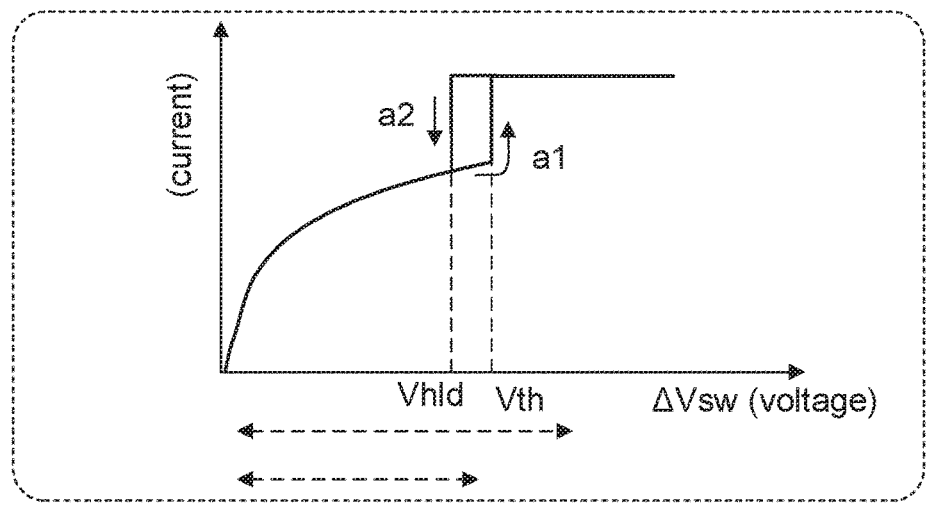
FIG. 4A is a schematic diagram illustrating current-voltage characteristic of the selector switch.

FIG. 4A is a schematic diagram illustrating current-voltage characteristic of the selector switch. The selector switch SEL can be, for example, an Ovonic Threshold Switch (hereinafter, OTS). The selector switch SEL transits between the "ON" state and the "OFF" state in response to the selector cross voltage ΔVsw. The arrow a1 in FIG. 4A shows that the state of the selector switch SEL changes from the OFF state to the ON state when the selector cross voltage ΔVsw exceeds a threshold voltage Vth. Once the selector cross voltage ΔVsw is greater than or equivalent to the threshold voltage Vth, the ON state is triggered and the selector switch SEL is in a substantially conductive state.

As shown by the arrow a2, if the selector cross voltage ΔVsw drops and becomes lower than a hold voltage Vhld, the selector switch SEL will return to the OFF state. On the other hand, once the selector cross voltage ΔVsw becomes greater than the threshold voltage Vth and drops back, and the selector cross voltage ΔVsw still remains to be greater than the hold voltage Vhld, the selector switch SEL stays at the ON state.

The threshold voltage Vth of the selector switch SEL is not always constant. In practical applications, the threshold voltage Vth gradually increases with aging of the memory device. That is, the longer the memory device is used, the greater the threshold voltage Vth of the selector switch SEL is. In order to ensure the selector switch SEL can be correctly and successfully turned on whenever necessary, the controller usually applies the selector cross voltage ΔVsw which is higher than actually required to the turn on the selector switch SEL. Since the selector switch SEL and the storage element PCM are manufactured and tied together in the memory cell, increase of the selector cross voltage ΔVsw implies that the cell cross voltage ΔVmem is increased. However, the design that a cell cross voltage ΔVmem with the value higher than necessity for turning on the selector switch SEL may degrade the characteristic of the storage element PCM.

In short, the voltages being applied to the n-th word line and the m-th bit line in order to turn on the selector switch SEL may result in read disturb phenomenon to the storage element PCM. To reduce the side effects caused by applying the high cell cross voltage ΔVmem, the current-voltage characteristic of the selector switch SEL is utilized in performing a read operation of the memory cell including the storage element PCM and the selector switch SEL. A generic concept about the relationship between the selector cross voltage ΔVsw and the read operation is firstly introduced.

Figure 4B:
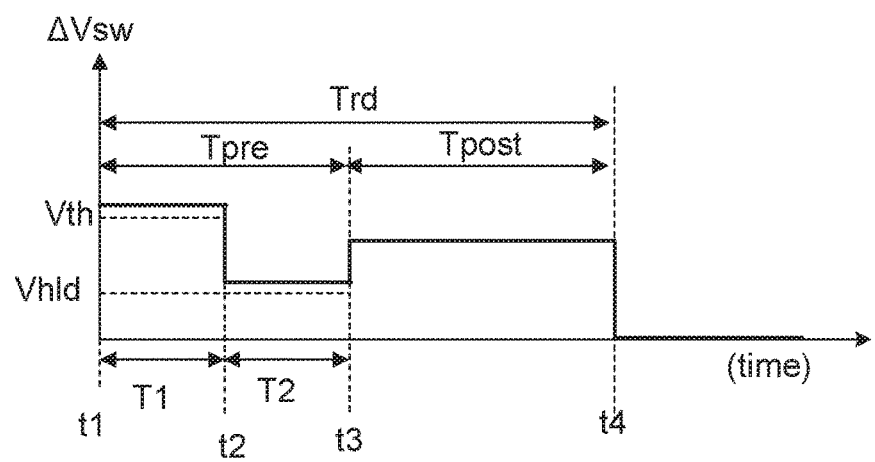
FIG. 4B is a schematic diagram illustration changes of the selector cross voltage ΔVsw during the read operation of the memory cell.

FIG. 4B is a schematic diagram illustration changes of the selector cross voltage ΔVsw during the read operation of the memory cell. The duration of the read operation Trd can include a preset duration Tpre and a post duration Tpost. The preset duration Tpre further includes two sub durations, that is, a first duration T1 between time point t1 and time point t2, and a second duration T2 between time point t2 and time point t3.

During the first duration T1, the selector cross voltage ΔVsw is controlled to be greater than the threshold voltage Vth. During the second duration T2, the selector cross voltage ΔVsw is controlled to be lower than the threshold voltage Vth but greater than the hold voltage Vhld. During the post duration Tpost, the selector cross voltage ΔVsw increases again. The selector cross voltage ΔVsw during the post duration Tpost is lower than its value in the first duration T1 and greater than its value in the second duration T2.

The length of the durations T1 and T2, and the post duration Tpost are related to types and characteristic of the selector switch SEL. For example, the first duration T1 can be greater than or equivalent to 20 ns, the second duration T2 can be equivalent to 20 ns, and the post duration Tpost can be equivalent to 200 ns.

As illustrated above, the cell cross voltage ΔVmem is equivalent to summation of the selector cross voltage ΔVsw and the storage cross voltage ΔVpcm. Therefore, the cell cross voltage ΔVmem has similar character as the selector cross voltage ΔVsw shown in FIG. 4B.

Figure 5:
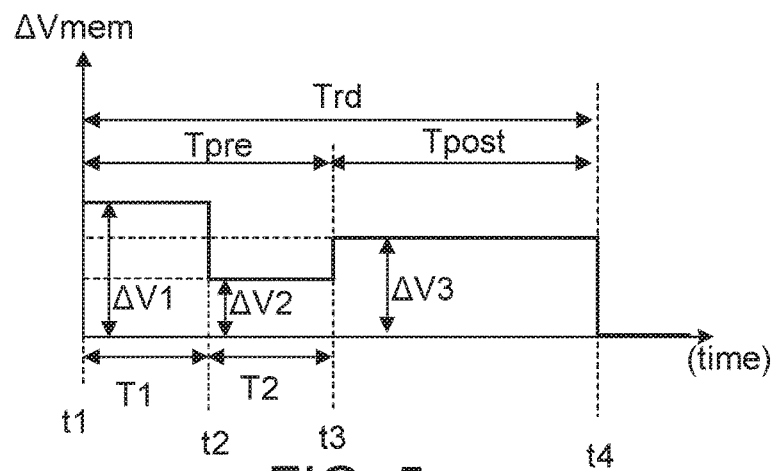
FIG. 5 is a schematic diagram illustrating changes of the cell cross voltage ΔVmem during the read operation of the memory cell.

FIG. 5 is a schematic diagram illustrating changes of the cell cross voltage ΔVmem during the read operation of the memory cell. According to the embodiments of the present disclosure, the control method to be applied in read operation of the memory device can be divided into three stages, the first duration T1, the second duration T2, and the post duration Tpost.

The cell cross voltage ΔVmem during the first duration T1 is defined as a first voltage difference ΔV1, the cell cross voltage ΔVmem during the second duration T2 is defined as a second voltage difference ΔV2, and the cell cross voltage ΔVmem during the post duration Tpost is defined as a third voltage difference ΔV3. The first voltage difference ΔV1 is greater than the third voltage difference ΔV3, and the third voltage difference ΔV3 is greater than the second voltage difference ΔV2.

The first voltage difference ΔV1 during the first duration T1 can force the selector switch SEL changes from the OFF state to the ON state. On the other hand, the second voltage difference ΔV2 shrinks the cross voltage ΔVmem. Lowering the voltage difference of ΔVmem soon after the selector switch SEL is turned on can ensure the selector switch SEL remains to be at the ON state without generating a big current flowing through the selector switch SEL, so as the storage element PCM. Therefore, the read disturb phenomenon caused at the storage element PCM can be prevented.

Figure 6:
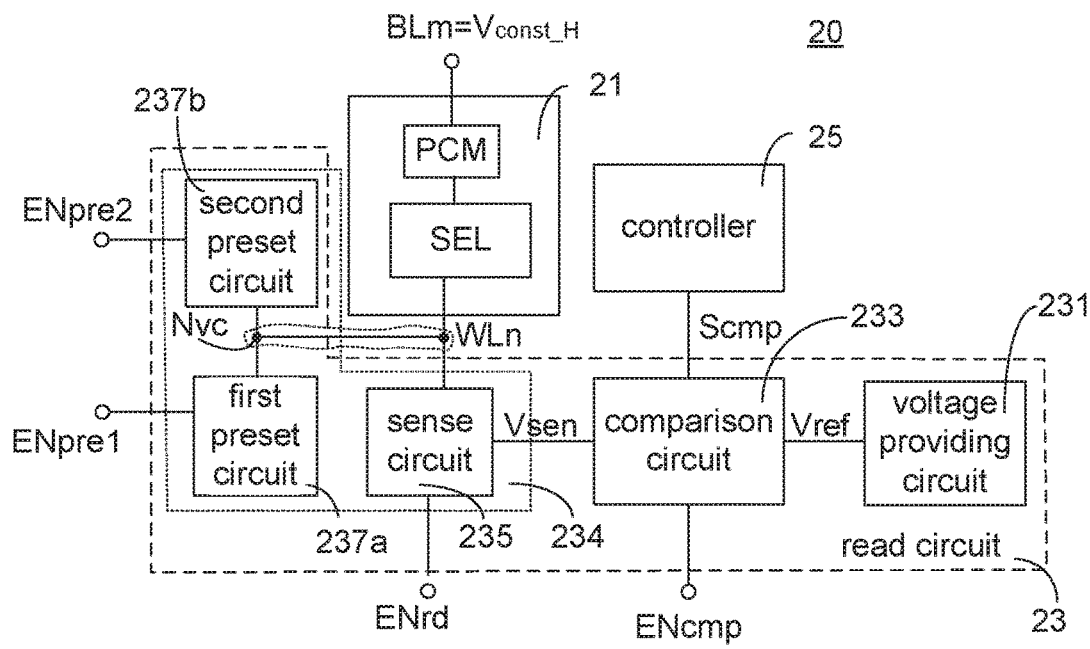
FIG. 6 is a schematic block diagram illustration design of the read circuit according to the embodiment shown in FIG. 3A.

FIG. 6 is a schematic block diagram illustration design of the read circuit according to the embodiment shown in FIG. 3A. The read circuit 23 includes a sense module 234, a comparison circuit 233, and a voltage providing circuit 231, and the sense module 234 further includes a first preset circuit 237a, a second preset circuit 237b and a sense circuit 235. The memory cell 21 includes a storage element PCM and a selector switch SEL.

The n-th word line WLn, the first preset circuit 237a, the second preset circuit 237b, and the sense circuit 235 are electrically connected to each other through the dynamic control terminal Nvc. Voltage of the dynamic control terminal Nvc is changed in a stage based control manner during the read duration Trd. During the read duration Trd, the storage element PCM receives a predefined constant voltage $V_{const\_H}$ through the m-th bit line BLm.

During a read operation, the comparison circuit 233 receives a sensing voltage Vsen from the sense circuit 235. Because the resistance of the storage element PCM is related to the storage state of the storage element PCM, the cell cross voltage ΔVmem is changed in response to the storage state of the storage element PCM. Consequentially, the voltage of the n-th word line WLn and the sensing voltage Vsen are related to the storage state of the storage element PCM.

In addition, the voltage providing circuit 231 provides a reference voltage Vref to the comparison circuit 233. After receiving the sensing voltage Vsen and the reference voltage Vref, the comparison circuit 233 accordingly generates a comparison signal Scmp to the controller 25. For example, if the sensing voltage Vsen is greater than the reference voltage Vref, the comparison signal Scmp is at a first voltage level, and if the sensing voltage Vsen is lower than the reference voltage Vref, the comparison signal Scmp is at a second voltage level.

The comparison signal Scmp is corresponding to the storage state of the storage element PCM in the memory cell 21, and the storage state of the storage element PCM represents data content being stored at the storage element PCM. Later, the controller 25 determines data content of the storage element PCM based on the voltage level of the comparison signal Scmp. For example, the controller 25 determines the data content of the storage element PCM in the memory cell is "1" when the comparison signal Scmp is at the first voltage level; and the controller 25 determines the data content of the storage element PCM in the memory cell is "O" when the comparison signal Scmp is at the second voltage level.

In FIG. 6, the comparison circuit 233 receives a comparison enable signal ENcmp from the controller 25, the sense circuit 235 receives a read enable signal ENrd from the controller 25, the first preset circuit 237a receives a first enable signal ENpre1 from the controller 25, and the second preset circuit 237b receives a second enable signal ENpre2 from the controller 25. These enable signals are generated by the controller 25 to control their counterpart circuits. Details about usage and function of the first enable signal ENpre1, the second enable signal ENpre2, the read enable signal ENrd, and the comparison enable signal ENcmp are illustrated in FIG. 7.

Figure 7:
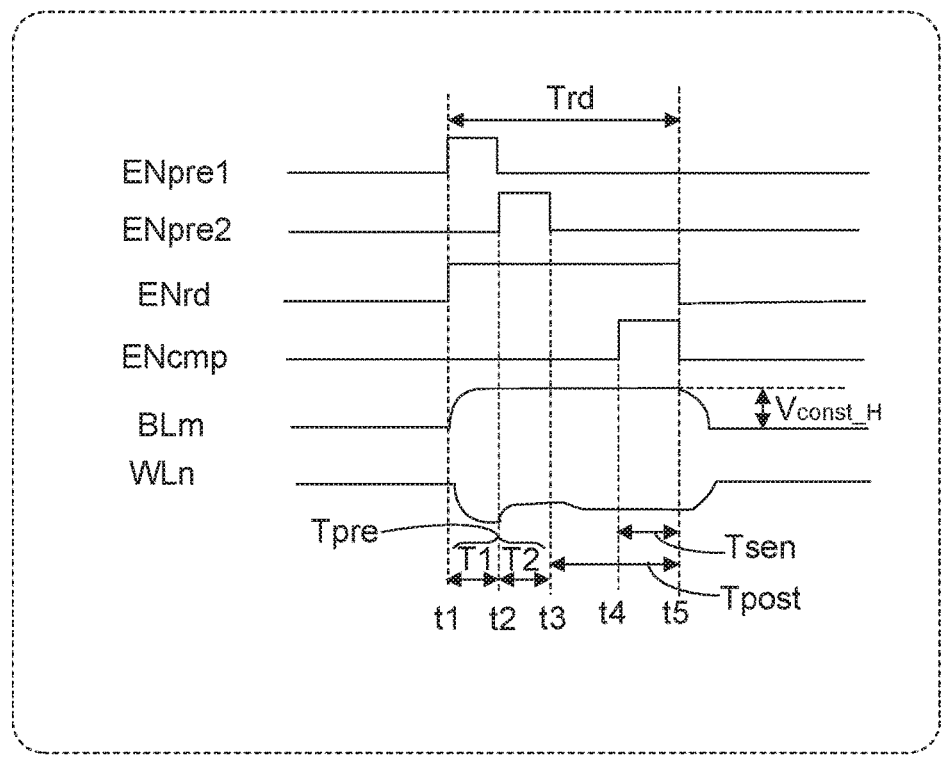
FIG. 7 is a schematic waveform diagram illustration signal control of the bock diagram shown in FIG. 6.

FIG. 7 is a schematic waveform diagram illustration signal control of the bock diagram shown in FIG. 6. The duration while the read circuit performing the read operation is defined as the read duration Trd. Moreover, a voltage difference between the m-th bit line BLm and the n-th word line WLn is equivalent to the cell cross voltage ΔVmem.

The first enable signal ENpre1 is at the high logic level between time point t1 and time point t2, that is, the first duration T1. The second enable signal ENpre2 is at the high logic level between time point t2 and time point t3, that is, the second duration T2. The read enable signal ENrd is at the high logic level between time point t1 and time point t5, that is, the read duration Trd. The comparison enable signal ENcmp is at the high logic level between time point t4 and time point t5, that is, the sensing duration Tsen.

Both the m-th bit line BLm and the n-th word line WLn are set at the default voltage (1.5V) before and after the read duration Trd. The m-th bit line BLm rises at time point t1 to the predefined constant voltage $V_{const\_H}$ (for example, 2.2V) and remains at the predefined constant voltage during the read duration Trd. During the read duration Trd, the first enable signal ENpre1, the second enable signal ENpre2, the read enable signal ENrd and the comparison enable signal ENcmp jointly change the voltage of the n-th word line WLn.

In the first duration T1, the voltage of the n-th word line WLn drops from the default voltage (1.5V) to a relatively low level. In the second duration T2, the voltage of the n-th word line WLn increase from the relatively low level to a relatively high level. During the post duration Tpost, the voltage of the n-th word line WLn changes from the relatively high level to a middle level and basically remains at the middle level until the comparison enable signal ENcmp drops to the low logic level. After the read duration Trd, voltages of the m-th bit line BLM and the n-th word line WLn gradually return to the default voltage (1.5V).

Details about how the first enable signal ENpre1, the second enable signal ENpre2, the read enable signal ENrd and the comparison enable signal ENcmp cause voltage changes of the n-th word line WLn, how voltage of the n-th word line WLn changes in response, and how the controller receives the comparison signal are illustrated below.

Figure 8:
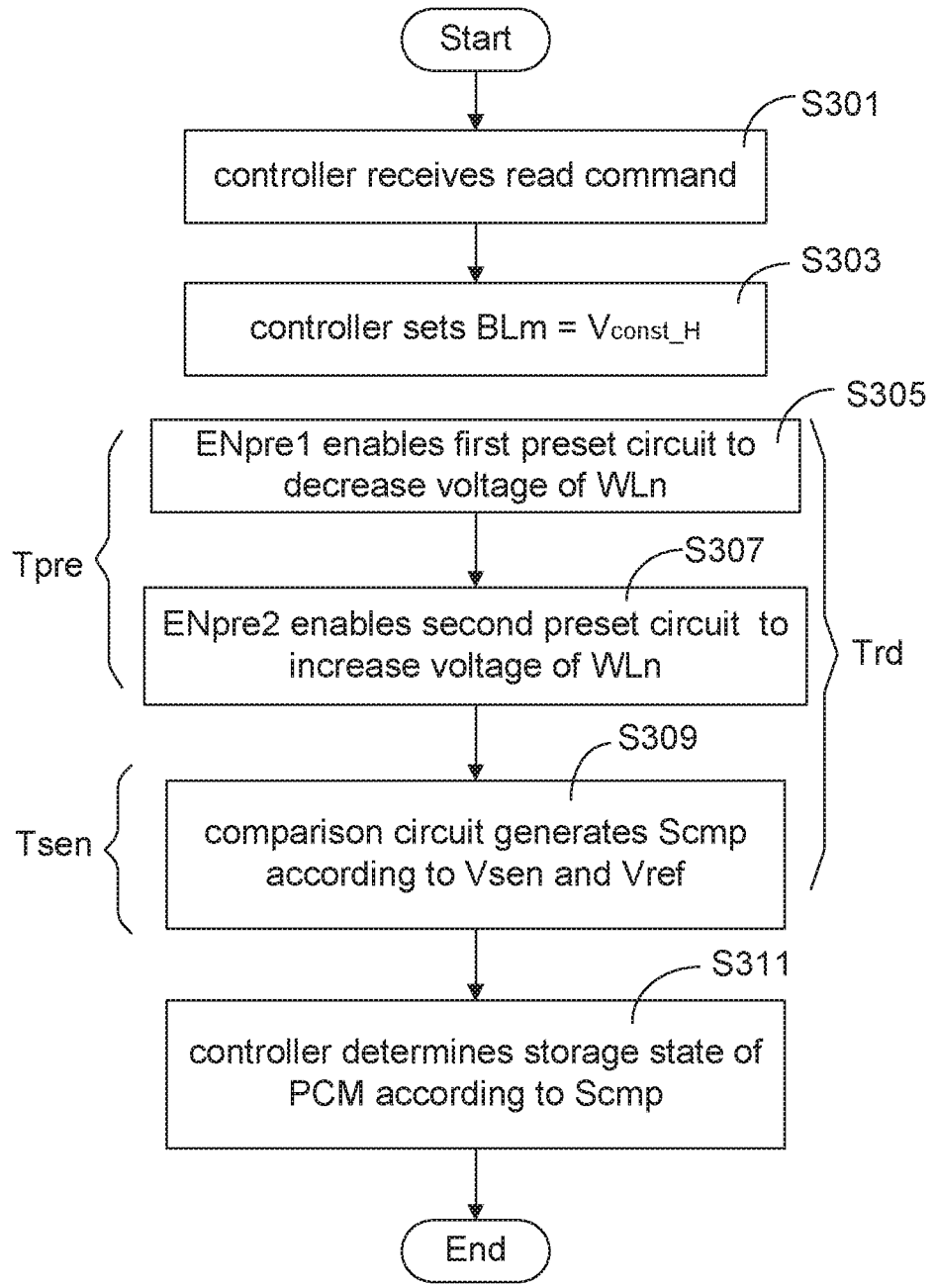
FIG. 8 is a schematic flow diagram illustrating the control method applied to the memory device according to the embodiment of the present disclosure.

FIG. 8 is a schematic flow diagram illustrating the control method applied to the memory device according to the embodiment of the present disclosure. The controller 25 receives a read command from a host (not shown) (step S301), and the controller 25 sets the voltage of the m-th bit line BLm at the predefined constant voltage $V_{const\_H}$ (step S303).

Then, the read duration Trd and the preset Tpre duration start. In the preset duration Tpre, the first enable signal ENpre1 firstly enables the first preset circuit 237a. After being enabled, the first preset circuit 237a conducts the n-th word line WLn toward a lower voltage VRDP+|Vtp| so that the voltage of the n-th word line WLn is decreased (step S305). The variable Vtp represents the threshold voltage of the PMOS transistor.

The second enable signal ENpre2 then enables the second preset circuit 237b. After being enabled, the second preset circuit 237b conducts the n-th word line to the supply voltage terminal (Vcc) so that the voltage of the n-th word line WLn is increased (step S307).

After the preset duration Tpre, the post duration Tpost starts. At the beginning of the post duration Tpost, the read circuit 23 waits a settling period to be well prepared to discriminate the state of accessed cell before the sensing duration Tsen starts. The voltage of the dynamic control terminal Nvc becomes stable before the sensing duration Tsen starts, and the voltage of the dynamic control terminal Nvc is directly related to the sensing voltage Vsen. In the sensing duration Tsen, the comparison circuit 233 generates comparison signal Scmp according to the sensing voltage Vsen and the reference voltage Vref (step S309). Consequentially, the controller 25 determines the storage state of storage element PCM according to the comparison signal Scmp (step S311).

Please refer to FIGS. 6, 7 and 8 together. The sense circuit 235 is controlled by the read enable signal ENrd. Because the read enable signal ENrd is at the high logic level during the read duration Trd, the sense circuit 235 continually operates during the read duration Trd.

The read duration Trd includes the preset duration Tpre and the post duration Tpost, and the preset duration Tpre further includes the first duration T1 and the second duration T2. In the first duration T1, the first preset circuit 237a is enabled by the first enable signal ENpre1. Therefore, a first preset current Ipre1 originating from the dynamic control terminal Nvc flows through the first preset circuit 237a toward a lower voltage equivalent to VRDP+|Vtp|, and the voltage of the n-th word line WLN drops during the first duration T1.

Although the sense circuit 235 is in operation, no current flows through the sense circuit 235 during the first duration T1 because the cell cross voltage ΔVmem is not big enough so that the selector cross voltage ΔVsw is not greater than the threshold voltage Vth of the selector switch SEL. Alternatively speaking, the selector cross voltage ΔVsw is insufficient to change the state of the selector switch SEL, and the selector switch SEL is still at OFF state during the first duration T1. Such case represents that the storage element PCM is not selected and the waveform shown in FIG. 7 is not applicable. The following descriptions are based on the assumption that the selector switch SEL is turned on at the end of the first duration T1.

By time point t2, the selector cross voltage ΔVsw is big enough so that the selector cross voltage ΔVsw is greater than the threshold voltage Vth of the selector switch SEL. In consequence, the selector switch SEL changes its state to the ON state and remains at the ON state during the second duration T2. Because the selector switch SEL is at the ON state during the second duration T2, a memory current Imem originating from the m-th bit line BLm flows through the memory cell and the n-th word line WLn to the sense circuit 235.

In order to read the storage state (data bit) of the storage element PCM, the controller applies a reading voltage Vread to the memory cell whose storage element PCM has been selected for reading. By receiving the reading voltage Vread, the selector switch SEL corresponding to the storage element PCM being selected is turned on, and a threshold current Ith thus flows through the memory cell. Meanwhile, the selector cross voltage ΔVsw is equivalent to the threshold voltage of the switch selector SEL.

In a case that the storage element PCM is at a SET state and the selector switch SEL is turned on, the selector cross voltage ΔVsw is equivalent to the threshold voltage of the switch selector SEL (ΔVsw=Vth) and the storage cross voltage ΔVpcm is equivalent to a product of a set-state resistance of the storage element PCM (Rset) and the threshold current (Ith) (ΔVpcm=Rset*Ith). The product of the set-state resistance of the storage element PCM (Rset) and the threshold current (Ith) can be considered as a reading threshold voltage Vth_rd_set of the storage element PCM at the "SET" state (Vth_rd_set=Rset*Ith). Accordingly, the cell cross voltage ΔVmem can be obtained by ΔVmem=ΔVsw+ΔVpcm=Vth+Rset*Ith if the storage element PCM of the memory cell being selected for the read operation is at the "SET" state.

In a case that the storage element PCM is at a RESET state and the selector switch SEL is turned on, the selector cross voltage ΔVsw is equivalent to the threshold voltage of the switch selector SEL (ΔVsw=Vth) and the storage cross voltage ΔVpcm is equivalent to a product of a reset-state resistance of the storage element PCM (Rreset) and the threshold current (Ith) (ΔVpcm=Rreset*Ith). The product of the reset-state resistance of the storage element PCM (Rreset) and the threshold current (Ith) can be considered as a reading threshold voltage Vth_rd_reset of the storage element PCM at the "RESET" state (Vth_rd_reset=Rreset*Ith). Accordingly, the cell cross voltage ΔVmem can be obtained by ΔVmem=ΔVsw+ΔVpcm=Vth+Rreset*Ith if the storage element PCM of the memory cell being selected for the read operation is at the "RESET" state.

For the storage element PCM, the reading threshold voltage of the storage element PCM at the "RESET" state (Vth_rd_reset) is greater than the reading threshold voltage of the storage element PCM at the "SET" state (Vth_rd_set). That is, Vth_rd_reset>Vth_rd_set. Such difference of the reading threshold voltage of the storage element PCM can thus be utilized to distinguish the SET/RESET state of the storage element PCM.

For the sake of illustration, a summation of the threshold voltage Vth of the switch selector SEL and the reading threshold voltage of the storage element PCM at the "SET" state Vth_rd_set can be defined as a cell reading threshold voltage of the SET state, and another summation of the threshold voltage Vth of the switch selector SEL and the reading threshold voltage Vth_rd_set of the storage element PCM at the "RESET" state can be defined as a cell reading threshold voltage of the RESET state.

When the reading voltage Vread is applied to the memory cell so that the cell cross voltage ΔVmem is greater than the cell reading threshold voltage of the SET state and lower than the cell reading threshold voltage of the RESET state, the storage element PCM at the "SET" state can conduct the threshold current Ith but the storage element PCM at the "RESET" state cannot. Therefore, by providing the reading voltage Vread which is greater than the cell reading threshold voltage of the SET state and lower than the cell reading threshold voltage of the RESET state, the storage state of the storage element PCM can be easily confirmed by detecting whether the threshold current Ith generates. In response to generation of the threshold current Ith, the sense circuit 235 can accordingly change the sensing voltage Vsen.

Based on the illustrations above, the cell cross voltage ΔVmem at the time point t2 needs to be sufficient to turn on the selector switch SEL whose corresponding storage element PCM is at the "SET" state, but not sufficient to turn on the selector switch SEL whose corresponding storage element PCM is at the "RESET" state.

Moreover, during the second duration T2, the second preset circuit 237b is enabled by the second enable signal ENpre2 so that a second preset current Ipre2 is conducted from the supply voltage terminal (Vcc) to the dynamic control terminal Nvc. Furthermore, the voltage of the n-th word line WLn increases during the second duration T2 because of the second preset current Ipre2.

In the second duration T2, the memory current Imem and the second preset current Ipre2 flow to and merge at the n-th word line WLn, and a merged current Imer is formed. The merged current Imer then flows through the sense circuit 235. Accordingly, the selector switch SEL is maintained at the ON state during the second duration T2 so that the cell cross voltage ΔVmem of the storage element PCM being at the SET state can be reduced.

After the second enable signal ENpre2 drops to the low logic level at time point t3, the second preset circuit 237b is disabled. Therefore, the second preset current Ipre2 no longer exists during the post duration Tpost, and voltage of the dynamic control terminal Nvc drops. Then, voltage of the n-th word line WLn drops and becomes a little bit lower than its voltage level duration the second duration T2.

During the post duration Tpost, the memory current Imem continually flows from the m-th bit line BLm to the dynamic control terminal Nvc. The memory current Imem is considered as a sensing current Isen that flows through the sense circuit 235 to the ground terminal Gnd. With the sensing current Isen, the voltage of the n-th word line WLn is still greater than its voltage value at time point t2. Then, the sense circuit 235 generates the sensing voltage Vsen based on the memory current Imem.

During the sensing duration Tsen, the comparison enable signal ENcmp is at the high logic level to enable the comparison circuit 233. In addition to the sensing voltage Vsen, the comparison circuit 233 also receives the reference voltage Vref from the voltage providing circuit 231.

If the sensing voltage Vsen is greater than the reference voltage Vref, the comparison circuit 233 generates the comparison signal Scmp at a first logic level. If the sensing voltage Vsen is lower than the reference voltage Vref, the comparison circuit 233 generates the comparison signal Scmp at a second logic level. Based on the logic level of the comparison signal Samp, the controller 25 can determine the storage state of storage element PCM in the memory cell 21.

Figure 9:
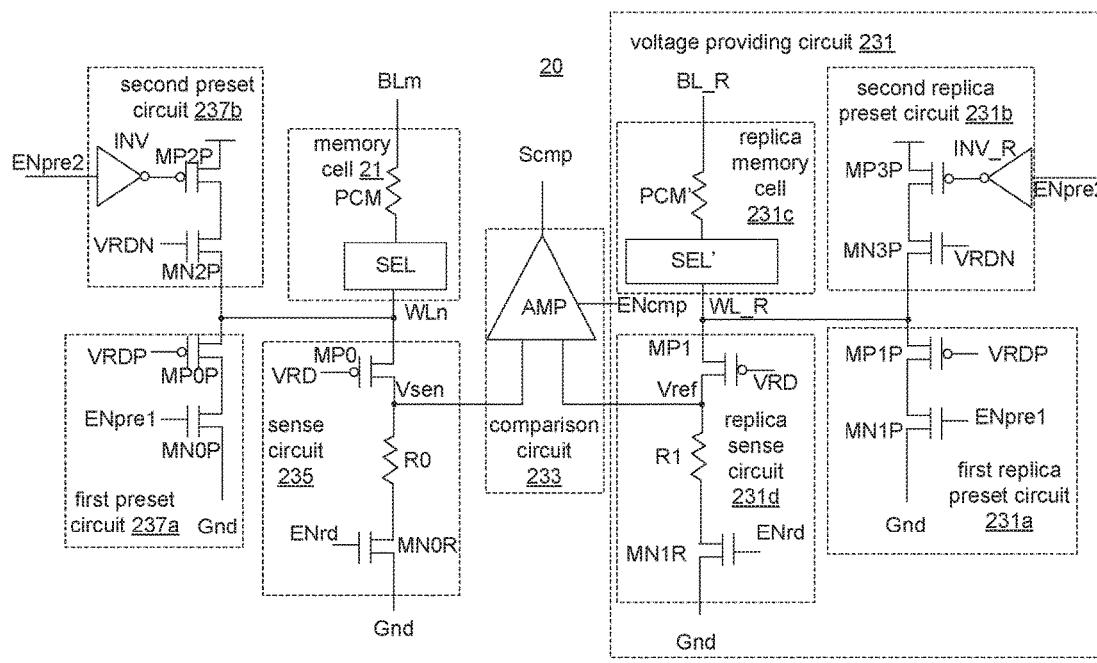
FIG. 9 is a schematic block diagram illustrating a circuitry implementation of FIG. 6.

FIG. 9 is a schematic block diagram illustrating a circuitry implementation of FIG. 6. The sense circuit, the memory cell, and the replica module are respectively illustrated. In the embodiment, the voltage providing circuit 231 can have replica circuits which are symmetric to the memory cell 21, the sense circuit 235, the first preset circuit 237a, and the second preset circuit 237b.

In FIG. 9, the voltage providing circuit 231 is assumed to include a replica memory cell 231c, a replica sense circuit 231d, a first replica preset circuit 231a, and a second replica preset circuit 231b. The replica memory cell 231c includes a replica storage element PCM' and a replica selector switch SEL'. The replica storage element PCM' is electrically connected to a reference bit line BL_R, and the replica selector switch SEL' is electrically connected to the replica sense circuit 231d. The first replica preset circuit 231a and the second replica preset circuit 231b respectively receive the first enable signal ENpre1 and the second enable signal ENpre2 from the controller 25.

The operations of the circuits in the voltage providing circuit 231 are basically similar to their counterparts and details are not redundantly described. The replica storage element PCM' is assumed to have a resistance equivalent to a middle value of the resistance when the storage element PCM is highly conductive and the resistance when the storage element PCM is at highly resistive. For example, if the resistance of the storage element PCM at the highly conductive state is 100 k ohm, and the resistance of the storage element PCM at the highly resistive state is 1 M ohm, the resistance of the replica storage element PCM' can be set to 500K ohm.

In FIG. 9, the first preset circuit 237a includes a PMOS transistor MP0P and an NMOS transistor MN0P. Similarly, the first replica preset circuit 231a includes a PMOS transistor MP1P and an NMOS transistor MN1P.

The drain terminals of the PMOS transistor MP0P and the NMOS transistor MN0P are electrically connected to each other, and the drain terminals of the PMOS transistor MP1P and the NMOS transistor MN1P are electrically connected to each other. The source terminals of the NMOS transistors MN0P and MN1P are electrically connected to the ground terminal (Gnd).

The PMOS transistors MP0P and MP1P are controlled by a first bias voltage VRDP, and the NMOS transistors MN0P and MN1P are controlled by the second enable signal ENpre2. The source terminal of the PMOS transistor MP0P is electrically connected to the n-th word line WLn, and the source terminal of the PMOS transistor MP1P is electrically connected to a reference word line WL_R. The first bias voltage VRDP is assumed to be constant to keep the PMOS transistors MP0P and MN1P turned on.

Once the first enable signal ENpre1 is at the high logic level, the NMOS transistors MN0P and MN1P are turned on, and the first preset current Ipre1 and a first replica preset current Ipre1' are conducted in response. The first preset current Ipre1 flows through the PMOS transistor MP0P and the NMOS transistor MN0P, and the first replica preset current Ipre1' flows through the PMOS transistor MP1P and the NMOS transistor MN1P.

In FIG. 9, the second preset circuit 237b includes an inverter INV, a PMOS transistor MP2P and an NMOS transistor MN2P. Similarly, the second replica preset circuit 231b includes an inverter INV_R, a PMOS transistor MP3P and an NMOS transistor MN3P.

The source terminals of the PMOS transistors MP2P and MP3P are electrically connected to the supply voltage terminal (Vcc). The drain terminals of the PMOS transistor MP2P and the NMOS transistor MN2P are electrically connected to each other, and the drain terminals of the PMOS transistor MP3P and the NMOS transistor MN3P are electrically connected to each other. The source terminal of the NMOS transistor MN2P is electrically connected to the n-th word line WLn, and the source terminal of the NMOS transistor MN3P is electrically connected to the reference word line WL_R.

In the second preset circuit 237b, the inverter INV receives the second enable signal ENpre2 to control the PMOS transistor MP2P, and the NMOS transistor MN2P is controlled by a second bias voltage VRDN. In the second replica preset circuit 231b, the inverter INV_R receives the second enable signal ENpre2 to control the PMOS transistor MP3P, and the NMOS transistor MN3P is controlled by the second bias voltage VRDN. The second bias voltage VRDN is assumed to be constant to keep the NMOS transistors MN2P and MN3P turned on.

Once the second enable signal ENpre2 is at the high logic level, the PMOS transistors MP2P and MP3P are turned on, and the second preset current Ipre2 and a second replica preset current Ipre2' are conducted in response. The second preset current Ipre2 flows through the PMOS transistor MP2P and the NMOS transistor MN2P, and the second replica preset current Ipre2' flows through the PMOS transistor MP3P and the NMOS transistor MN3P.

In FIG. 9, the sense circuit 235 includes a PMOS transistor MP0, a resistor R0, and an NMOS transistor MN0R. Similarly, the replica sense circuit 231d includes a PMOS transistor MP1, a resistor R1, and an NMOS transistor MN1R. The resistances of the resistor R0 and R1 are equivalent.

The source terminal of the PMOS transistor MP0 is electrically connected to the n-th word line WLn, and the source terminal of the PMOS transistor MP1 is electrically connected to the reference word line WL_R. The drain terminal of the PMOS transistor MP0 and the resistor R0 are jointly electrically connected to an input of the comparison circuit 233. The drain terminal of the PMOS transistor MP1 and the resistor R1 are jointly electrically connected to another input of the comparison circuit 233. The drain terminal and the source terminal of the NMOS transistor MN0R are respectively electrically connected to the resistor R0 and the ground terminal (Gnd). The drain terminal and the source terminal of the NMOS transistor MN1R are respectively electrically connected to the resistor R1 and the ground terminal (Gnd).

In the sense circuit 235, the PMOS transistor MP0 is controlled by a read bias voltage VRD, and the NMOS transistor MN0R is controlled by the read enable signal ENrd. In the replica sense circuit 231d, the PMOS transistor MP1 is controlled by the read bias voltage VRD, and the NMOS transistor MN1R is controlled by the read enable signal ENrd. The read bias voltage VRD is assumed to be constant to keep the PMOS transistors MP0 and MP1 turned on.

Once the read enable signal ENrd is at the high logic level, the NMOS transistors MN0R and MN1R are turned on, and the sensing current Isen and a replica sensing current Isen' are conducted in response. The sensing current Isen flows through the PMOS transistor MP0, the resistor R0, and the NMOS transistor MN0R, and the replica sensing current Isen' flows through the PMOS transistor MP1, the resistor R1 and the NMOS transistor MN1R. Then, the sensing voltage Vsen can be obtained by timing the current value of the sensing current Isen and the resistance of the resistor R0, and the reference voltage Vref can be obtained by timing the current value of the replica sensing current Isen' and the resistance of the resistor R1.

Because the resistance of the resistors R0 and R1 are equivalent, comparison between the sensing voltage Vsen and the reference voltage Vref is related to the current values of the sensing current Isen and the replica sensing current Isen', which are actually dominated by the resistance of the storage element PCM and the replica storage element PCM', respectively. For this reason, the comparison signal Scmp can represent the storage state of the storage element PCM.

In FIG. 9, the comparison circuit 233 is a sense amplifier AMP being enabled by the comparison enable signal ENcmp. The sense amplifier AMP receives the sensing voltage Vsen from the sense circuit 235, and the reference voltage Vref from the replica sense circuit 231d. Then, the sense amplifier AMP outputs the comparison signal Scmp if the comparison enable signal ENcmp is at the high logic level.

Figure 10:
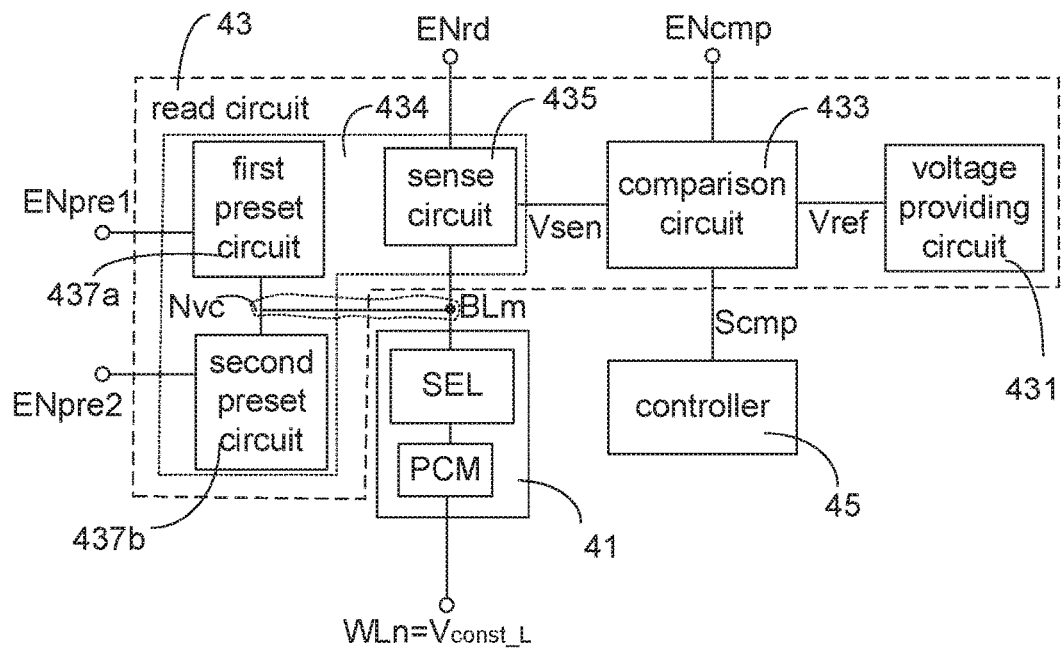
FIG. 10 is a schematic block diagram illustration design of the read circuit according to the embodiment shown in FIG. 3C.

FIG. 10 is a schematic block diagram illustration design of the read circuit according to the embodiment shown in FIG. 3C. The read circuit 43 includes a sense module 434, a comparison circuit 433 and a voltage providing circuit 431, and the sense module 434 further includes a first preset circuit 437a, a second preset circuit 437b, and a sense circuit 435. The memory cell 41 includes a storage element PCM and a selector switch SEL.

The m-th bit line BLm, the first preset circuit 437a, the second preset circuit 437b, and the sense circuit 435 are electrically connected to each other through the dynamic control terminal Nvc. Voltage of the dynamic control terminal Nvc is changed in a stage based control manner during the read duration Trd. During the read duration Trd, the storage element PCM receives a predefined constant voltage $V_{const\_L}$ through the n-th word line WLn.

During a read operation, the comparison circuit 433 receives a sensing voltage Vsen from the sense circuit 435. In addition, the voltage providing circuit 431 provides a reference voltage Vref to the comparison circuit 433. After receiving the sensing voltage Vsen and the reference voltage Vref, the comparison circuit 433 accordingly generates a comparison signal Scmp to the controller 45.

The comparison signal Scmp is corresponding to the storage state of the storage element PCM in the memory cell 41. Later, the controller 45 determines data content of the storage element PCM based on the comparison signal Scmp.

In FIG. 10, the comparison circuit 433 receives a comparison enable signal ENcmp from the controller 45, the sense circuit 235 receives a read enable signal ENrd from the controller 45, the first preset circuit 437a receives a first enable signal ENpre1 from the controller 45, the second preset circuit 437b receives a second enable signal ENpre2 from the controller 45. Basically, the circuits in FIG. 10 are similar to the ones in FIG. 6 except some polarities of the voltage are inversed so that current directions are opposite.

Figure 11:
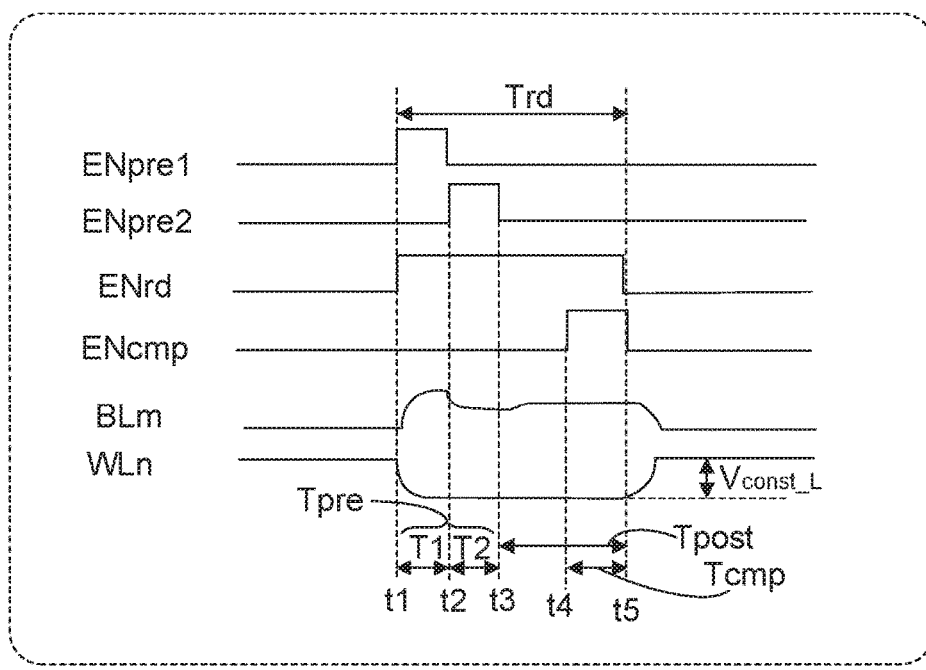
FIG. 11 is a schematic waveform diagram illustration signal control of the bock diagram shown in FIG. 9.

FIG. 11 is a schematic waveform diagram illustration signal control of the bock diagram shown in FIG. 9. The first enable signal ENpre1, the second enable signal ENpre2, the read enable signal ENrd, and the comparison enable signal ENcmp are the same as the ones in FIG. 7. Similarly, a voltage difference between the m-th bit line BLm and the n-th word line WLn is equivalent to the cell cross voltage ΔVmem.

Both the m-th bit line BLm and the n-th word line WLn are set at the default voltage (1.5V) before and after the read duration Trd. In FIG. 11, the voltage of the m-th bit line BLm changes in different durations, and the voltage of the n-th word line WLn is set at the predefined constant voltage $V_{const\_L}$ (for example, 0.8V).

In the first duration T1, the voltage of the m-th word line BLm increases from the default voltage (1.5V) to a relatively high level so that the selector cross voltage ΔVsw is greater than the threshold voltage Vth of the selector switch SEL in the first duration T1. In consequence, the selector switch PCM is turned on at the end of the first duration T1. In the second duration T2, the voltage of the m-th bit line BLm decreases from the relatively high level to a relatively low level. During the post duration Tpost, the voltage of the m-th bit line WLm changes from the relatively low level to a middle level and basically remains at the middle level until the comparison enable signal ENcmp drops to the low logic level.

The n-th word line WLn starts to drop at time point t1 to the predefined constant voltage $V_{const\_L}$ and remains at the predefined constant voltage $V_{const\_L}$ during the read duration Trd. After the read duration Trd, voltages of the m-th bit line BLm and the n-th word line WLn gradually return to the default voltage (1.5V).

Figure 12:
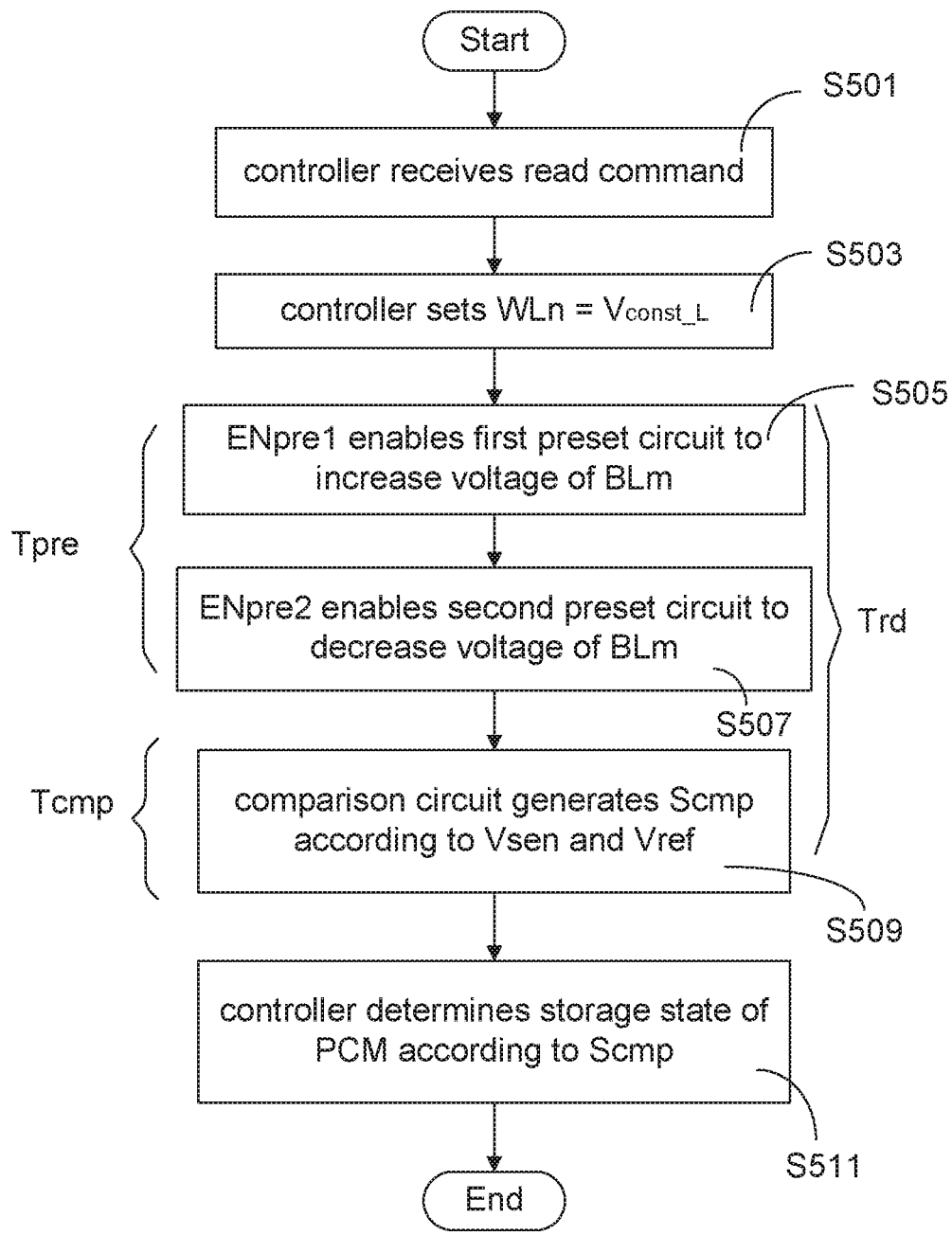
FIG. 12 is a schematic flow diagram illustrating the control method applied to the memory device according to the embodiment of the present disclosure.

FIG. 12 is a schematic flow diagram illustrating the control method applied to the memory device according to the embodiment of the present disclosure. The controller 45 receives a read command from a host (not shown) (step S501), and the controller 45 sets the voltage of the n-th word line WLn at the predefined constant voltage $V_{const\_L}$ (step S503).

Then, the read duration Trd and the preset Tpre duration start. In the preset duration Tpre, the first enable signal ENpre1 firstly enables the first preset circuit 437a. After being enabled, the first preset circuit 437a conducts the m-th bit line BLm to the supply voltage terminal (Vcc) so that voltage of the m-th bit line BLm is increased (step S505).

The second enable signal ENpre2 then enables the second preset circuit 437b. After being enabled, the second preset circuit 437b conducts the m-th bit line BLm toward VRDP+ |Vtp| so that voltage of the m-th bit line BLm is decreased (step S507).

After the preset duration Tpre, the post duration Tpost starts. At the beginning of the post duration Tpost, the read circuit 23 waits a setting period before the sensing duration Tsen starts. The voltage of the dynamic control terminal Nvc becomes stable before the sensing duration Tsen starts, and the voltage of the dynamic control terminal Nvc is directly related to the sensing voltage Vsen. In the sensing duration Tsen, the comparison circuit 433 generates the comparison signal Scmp according to the sensing voltage Vsen and the reference voltage Vref (step S509). Consequentially, the controller 45 determines the storage state of storage element PCM according to the comparison signal Scmp (step S511).

Figure 13:
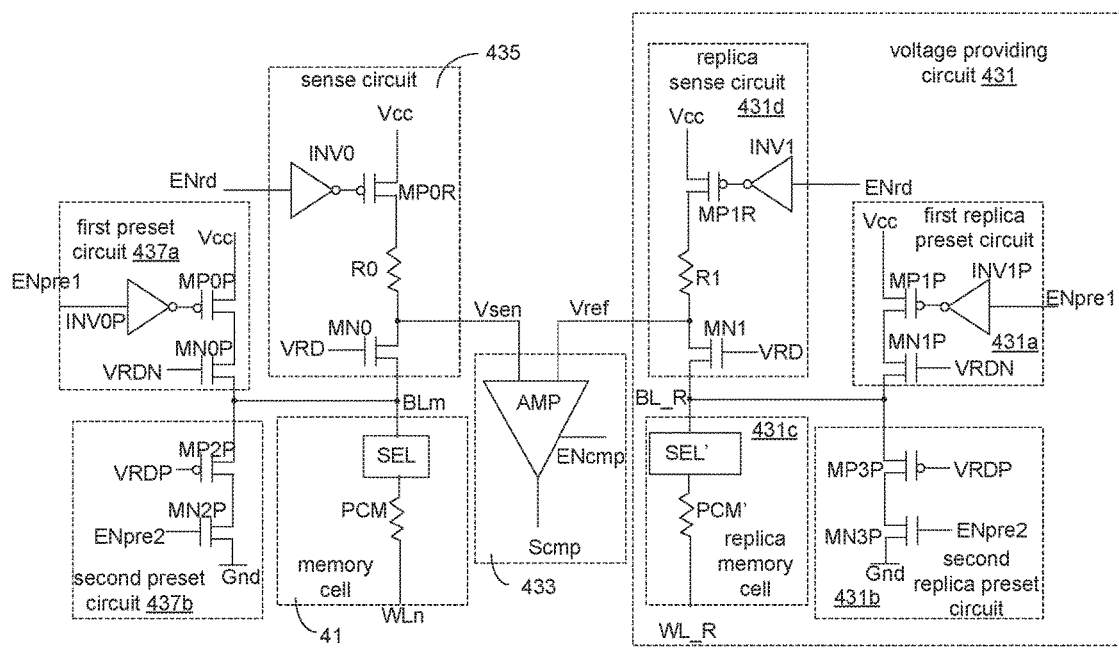
FIG. 13 is a schematic circuit diagram illustrating a circuitry implementation of FIG. 11.

FIG. 13 is a schematic block diagram illustrating a circuitry implementation of FIG. 10. In the embodiment, the voltage providing circuit 431 can have replica circuits which are symmetric to the memory cell 41, the sense circuit 435, the first preset circuit 437a, and the second preset circuit 437b.

In FIG. 13, the voltage providing circuit 231 is assumed to include a replica memory cell 431c, a replica sense circuit 431d, a first replica preset circuit 431a, and a second replica preset circuit 431b. The replica memory cell 231c includes a replica storage element PCM' and a replica selector switch SEL'. The replica storage element PCM' is electrically connected to a reference word line WL_R, and the replica selector switch SEL' is electrically connected to the replica sense circuit 431d. The first replica preset circuit 431a and the second replica preset circuit 431b respectively receive the first enable signal ENpre1 and the second enable signal ENpre2 from the controller 45.

The operations of the circuits in the voltage providing circuit 431 are basically similar to the ones described in FIG. 9 for the voltage providing circuit 231. Similarly, the storage element PCM in the replica memory cell 431c is assumed to have a resistance equivalent to a middle value of the resistance when the storage element PCM is highly conductive and the resistance when the storage element PCM is highly resistive.

In FIG. 13, the first preset circuit 437a includes an inverter INV0P, a PMOS transistor MP0P and an NMOS transistor MN0P. Similarly, the first replica preset circuit 431a includes an inverter INV1P, a PMOS transistor MP1P and an NMOS transistor MN1P. The PMOS transistors MP0P and MP1P are both controlled by a first bias voltage VRDN, and the NMOS transistors MN0P and MN1P are both controlled by the inversed enable signal ENpre1. The first bias voltage VRDN is assumed to be constant to keep the NMOS transistors MN0P and MN1P turned on.

Once the first enable signal ENpre1 is at the high logic level, the PMOS transistors MP0P and MP1P are turned on, and the first preset current Ipre1 and a first replica preset current Ipre1' are conducted in response. The first preset current Ipre1 originates from the supply voltage terminal (Vcc), flows through the PMOS transistor MP0P and the NMOS transistor MN0P to the m-th bit line BLm. Meanwhile, the first replica preset current Ipre1' originates from the supply voltage terminal (Vcc), flows through the PMOS transistor MP1P and the NMOS transistor MN1P to the reference bit line BL_R.

In FIG. 13, the second preset circuit 437b includes a PMOS transistor MP2P and an NMOS transistor MN2P. Similarly, the second replica preset circuit 431b includes a PMOS transistor MP3P and an NMOS transistor MN3P. In the second preset circuit 437b, the PMOS transistor MP2P is controlled by a second bias voltage VRDP, and the NMOS transistor MN2P is controlled by the second enable signal ENpre2. In the second replica preset circuit 431b, the PMOS transistor MP3P is controlled by the second bias voltage VRDP, and the NMOS transistor MN3P is controlled by the second enable signal ENpre2. The second bias voltage VRDP is assumed to be constant to keep the PMOS transistors MP2P and MP3P turned on.

Once the second enable signal ENpre2 is at the high logic level, the NMOS transistors MN2P and MN3P are turned on, and the second preset current Ipre2 and a second replica preset current Ipre2' are conducted in response. Starting from the m-th bit line BLm, the second preset current Ipre2 flows through the PMOS transistor MP2P and the NMOS transistor MN2P to the ground terminal (Gnd). Starting from the reference bit line BL_R, the second replica preset current Ipre2' flows through the PMOS transistor MP3P and the NMOS transistor MN3P to the ground terminal (Gnd).

In FIG. 13, the sense circuit 435 includes an inverter INV0, a PMOS transistor MP0R, a resistor R0, and an NMOS transistor MN0. Similarly, the replica sense circuit 431d includes an inverter INV1, a PMOS transistor MP1R, a resistor R1, and an NMOS transistor MN1. The resistances of the resistor R0 and R1 are equivalent. In the sense circuit 435, the PMOS transistor MP0R is controlled by the read enable signal ENrd, and the NMOS transistor MN0 is controlled by the read bias voltage VRD. In the replica sense circuit 431d, the PMOS transistor MP1R is controlled by the read enable signal ENrd, and the NMOS transistor MN1 is controlled by the read bias voltage VRD. The read bias voltage VRD is assumed to be constant to keep the NMOS transistors MN0 and MN1 turned on.

Once the read enable signal ENrd is at the high logic level, the PMOS transistors MP0R and MP1R are turned on, and the sensing current Isen and a replica sensing current Isen' are conducted in response. The sensing current Isen originating from the supply voltage terminal (Vcc) flows through the PMOS transistor MP0R, the resistor R0, and the NMOS transistor MN0, and the replica sensing current Isen' originating from the supply voltage terminal (Vcc) flows through the PMOS transistor MP1R, the resistor R1 and the NMOS transistor MN1. Then, the sensing voltage Vsen can be obtained by a voltage difference between the supply voltage terminal (Vcc) and timing result of the current value of the sensing current Isen and the resistance of the resistor R0; and the reference voltage Vref can be obtained by another voltage difference between the supply voltage terminal (Vcc) and timing result of the current value of the replica sensing current Isen' and the resistance of the resistor R1.

Because the resistance of the resistors R0 and R1 are equivalent, comparison between the sensing voltage Vsen and the reference voltage Vref is related to the current values of the sensing current Isen and the replica sensing current Isen', which are actually dominated by the resistance of the storage element PCM and the replica storage element PCM', respectively. For this reason, the comparison signal Scmp can represent the storage state of the storage element PCM.

In FIG. 13, the comparison circuit 433 is a sense amplifier AMP. The sense amplifier AMP receives the sensing voltage Vsen from the sense circuit 435, and receives the reference voltage Vref from the replica sense circuit 431d. Then, the sense amplifier AMP outputs the comparison signal Scmp.

According to the embodiments of the present disclosure, the cell cross voltage ΔVmem is dynamically adjusted in a stage based manner. The first duration T1 is utilized to enlarge the cell cross voltage ΔVmem so that the selector switch SEL can be turned on. The second duration T2 is utilized to shrink the cell cross voltage ΔVmem so that the selector SEL can stay at the ON state without causing read disturb at the storage element PCM. Then, the storage state of the storage element PCM is acquired in the post duration Tpost. In practical application, the storage elements can be other types of memristor such as resistive random-access memory (RRAM or ReRAM), magnetoresistive random-access memory (MRAM) and so forth.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, electrically connected to M bit lines and N word lines, comprising:
   a memory array, comprising MxN memory cells being located at intersections of the M bit lines and the N word lines, wherein a memory cell being electrically connected to an m-th bit line among the M bit lines and an n-th word line among the N word lines is defined as a selected memory cell, and the selected memory cell comprises:
   a storage element, electrically connected to one of the m-th bit line and the n-th word line, configured to receive a predefined voltage signal including a constant voltage portion during a read duration, the read duration comprising a first duration, a second duration, and a post duration, wherein a read operation is performed to the selected memory cell during the read duration; and
   a selector switch, electrically connected to the other one of the m-th bit line and the n-th word line, wherein the constant voltage portion of the predefined voltage signal is different from a voltage of the other one of the m-th bit line and the n-th word line during the read duration, wherein a selector cross voltage of the selector switch is greater than a threshold voltage of the selector switch in the first duration, the selector cross voltage of the selector switch is greater than or equivalent to a hold voltage of the selector after the first duration, and the selector cross voltage is between the hold voltage of the selector switch and the threshold voltage of the selector switch after the first duration; and
   a controller, electrically connected to the memory array, configured to:

change a cell cross voltage of the selected memory cell in the first duration, the second duration, and the post duration, respectively, wherein the cell cross voltage in the first duration is greater than the cell cross voltage in the post duration, and the cell cross voltage in the post duration is greater than the cell cross voltage in the second duration; and compare a sensing voltage and a reference voltage to determine a storage state of the storage element, wherein the sensing voltage represents the voltage of the other one of the m-th bit line and the n-th word line during the post duration.

2. The memory device according to claim 1, further comprises a plurality of read circuits, wherein the plurality of read circuits are respectively electrically connected to the M bit lines, or the plurality of read circuits are respectively electrically connected to the N word lines, and each of the read circuit comprises:

a voltage providing circuit, configured to provide a reference voltage;

a sense module, electrically connected to the selector switch through a dynamic control terminal, configured to provide a sensing voltage at the post duration; and a comparison circuit, electrically connected to the controller, the voltage providing circuit and the sense module, configured to generate and transmit a comparison signal representing the storage state of the storage element to the controller, wherein the comparison circuit generates the comparison signal according to the reference voltage and the sensing voltage.

3. The memory device according to claim 2, wherein the sense module comprises:

a sense circuit, electrically connected to the dynamic control terminal, configured to generate the sensing voltage in the post duration;

a first preset circuit, electrically connected to the dynamic control terminal, configured to conduct the dynamic control terminal to one of a supply voltage terminal and a ground terminal during the first duration; and a second preset circuit, electrically connected to the dynamic control terminal, configured to conduct the dynamic control terminal to the other one of the supply voltage terminal and the ground terminal during the second duration.

4. The memory device according to claim 3, wherein the sense circuit is enabled during the read duration, the first preset circuit is enabled during the first duration, the second preset circuit is enabled during the second duration, and the comparison circuit is enabled in the post duration.

5. The memory device according to claim 3, wherein the storage element is electrically connected to the m-th bit line, and the selector switch is electrically connected to the n-th word line through the dynamic control terminal, where in the m-th bit line is applied with the predefined voltage signal during the read duration, a voltage of the n-th word line changes during the read duration, and the constant voltage portion of the predefined voltage signal is greater than the voltage of the n-th word line during the read duration.

6. The memory device according to claim 3, wherein the storage element is electrically connected to the n-th word line, and the selector switch is electrically connected to the m-th bit line through the dynamic control terminal, wherein the n-th word line is applied with the predefined voltage signal during the read duration, a voltage of the m-th bit line changes during the read duration, and the constant voltage portion of the predefined voltage signal is lower than the voltage of the m-th bit line during the read duration.

7. The memory device according to claim 3, wherein the voltage providing circuit comprises:

a replica memory cell comprising a replica storage element and a replica selector switch; and a replica sense module, comprising:

a replica sense circuit, symmetric to the sense circuit, configured to generate the reference voltage in the post duration;

a first replica preset circuit, symmetric to the first preset circuit, configured to conduct the replica selector switch to the one of the supply voltage terminal and the ground terminal during the first duration; and a second replica preset circuit, symmetric to the second preset circuit, configured to conduct the replica selector switch to the other one of the supply voltage terminal and the ground terminal during the second duration.

8. The memory device according to claim 7, wherein the replica storage element is electrically connected to a reference bit line, and the replica selector switch is electrically connected to a reference word line; or the replica storage element is electrically connected to the reference word line, and the replica selector switch is electrically connected to the reference bit line.

9. A control method applied to a memory cell in a memory device, wherein the memory cell comprises a storage element and a selector switch, the storage element is electrically connected to an m-th bit line and the selector switch is electrically connected to an n-th word line, wherein the control methods comprises steps of:

applying the m-th bit line with a predefined voltage signal including a constant voltage portion during a read duration, the read duration comprising a first duration, a second duration, and a post duration, wherein a read operation is performed to the selected memory cell during the read duration, and a selector cross voltage is greater than a threshold voltage of the selector switch in the first duration;

changing a voltage of the n-th word line during the read duration, wherein a cell cross voltage of the memory cell in the first duration is greater than the cell cross voltage in the post duration, and the cell cross voltage in the post duration is greater than the cell cross voltage in the second duration, wherein the constant voltage portion of the predefined voltage signal is greater than the voltage of the n-th word line during the read duration; and comparing a sensing voltage and a reference voltage to determine a storage state of the storage element, wherein the sensing voltage represents the voltage of the n-th word line during the post duration.

10. The control method according to claim 9, wherein the step of changing the voltage of the n-th word line during the read duration further comprises steps of:

conducting the n-th word line to a lower voltage to decrease the voltage of the n-th word line during the first duration; and conducting the n-th word line to a supply voltage terminal to increase the voltage of the n-th word line during the second duration.

11. The control method according to claim 9, wherein a state of the selector switch changes from an OFF state to an ON state during the first duration, and the state of the selector switch remains at the ON state within the read duration.

12. A control method applied to a memory cell in a memory device, wherein the memory cell comprises a storage element and a selector switch, the storage element is electrically connected to an n-th word line and the selector switch is electrically connected to an m-th bit line, wherein the control methods comprises steps of:

applying the n-th word line with a predefined voltage signal including a constant voltage portion during a read duration comprising a first duration, a second duration, and a post duration, wherein a read operation is performed to the selected memory cell during the read duration, and a selector cross voltage is greater than a threshold voltage of the selector switch in the first duration;

changing a voltage of the m-th bit line during the read duration, wherein a cell cross voltage of the memory cell in the first duration is greater than the cell cross voltage in the post duration, and the cell cross voltage in the post duration is greater than the cell cross voltage in the second duration, wherein the constant voltage portion of the predefined voltage signal is lower than the voltage of the m-th bit line during the read duration; and comparing a sensing voltage and a reference voltage to determine a storage state of the storage element, wherein the sensing voltage represents the voltage of the m-th bit line during the post duration.

13. The control method according to claim 12, wherein the step of changing the voltage of the m-th bit line during the read duration further comprises steps of:

conducting the m-th bit line to a supply voltage terminal to increase the voltage of the m-th bit line during the first duration; and conducting the m-th bit line to a lower voltage to decrease the voltage of the m-th bit line during the second duration.

14. The control method according to claim 12, wherein a state of the selector switch changes from an OFF state to an ON state during the first duration, and the state of the selector switch remains at the ON state within the read duration.

* * * * *